(12) United States Patent
Abiru et al.

(10) Patent No.: US 6,747,355 B2
(45) Date of Patent: *Jun. 8, 2004

(54) SEMICONDUCTOR DEVICE AND METHOD FOR MANUFACTURING THE SAME

(75) Inventors: Takahisa Abiru, Tokyo (JP); Keisuke Hatano, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/196,430

(22) Filed: Jul. 17, 2002

(65) Prior Publication Data

US 2003/0015799 A1 Jan. 23, 2003

(30) Foreign Application Priority Data

Jul. 17, 2001 (JP) ........................................ 2001-216172

(51) Int. Cl.[7] .............................................. H01L 23/48
(52) U.S. Cl. .................. 257/758; 257/759; 257/760; 257/762; 257/774; 257/765; 438/118; 438/622; 438/623; 438/624; 438/687; 438/688; 438/629
(58) Field of Search .................... 257/758–765, 257/771, 774; 438/118, 622–624, 687, 683, 685, 688, 629, 637, 639, 640, 667, 672, 675, 700, 701, 713, 978

(56) References Cited

U.S. PATENT DOCUMENTS

| 6,084,304 A | * | 7/2000 | Huang et al. | ................. | 257/762 |
| 6,274,935 B2 | * | 8/2001 | Uzoh | ........................ | 257/762 |
| 6,303,505 B1 | * | 10/2001 | Ngo et al. | ................... | 438/687 |
| 6,376,353 B1 | * | 4/2002 | Zhou et al. | ................. | 438/612 |
| 6,424,036 B1 | * | 7/2002 | Okada | ......................... | 257/734 |
| 6,451,681 B1 | * | 9/2002 | Greer | ......................... | 438/601 |
| 6,468,906 B1 | * | 10/2002 | Chan et al. | ................. | 438/687 |
| 6,569,767 B1 | * | 5/2003 | Fujisawa et al. | ............ | 438/687 |
| 2001/0036716 A1 | * | 11/2001 | Chittipeddi et al. | ........ | 438/584 |
| 2002/0163083 A1 | * | 11/2002 | Hatano et al. | .............. | 257/762 |

FOREIGN PATENT DOCUMENTS

| JP | 7-201909 | 8/1995 |
| JP | 10-340920 | 12/1998 |

OTHER PUBLICATIONS

VLSI Manufacturing Technology, 1997, p. 454.

* cited by examiner

Primary Examiner—David Nelms
Assistant Examiner—Andy Huynh
(74) Attorney, Agent, or Firm—Young & Thompson

(57) ABSTRACT

A connection via hole is formed in an inter layer insulation film that covers a copper pad. Copper is formed within the connection via hole to form a connection copper via metal. An aluminum pad having a barrier metal thereunder for preventing reaction between copper and aluminum is formed on the connection copper via metal, thereby electrically connecting the copper pad and the aluminum pad to each other through the connection copper via metal. A step formed by the connection via hole that is formed in the inter layer insulation film is made substantially equal to zero with the aid of the connection copper via metal and at the same time, a film thickness of aluminum constituting the aluminum pad is reduced, thereby reducing manufacturing cost of the semiconductor device. Moreover, even when the connection copper via metal directly lying under the aluminum pad is oxidized, oxidation of the copper pad can be prevented, thereby advantageously preventing the breaking of copper interconnects connected to the copper pad and improving reliability of the semiconductor device.

10 Claims, 7 Drawing Sheets

SEMICONDUCTOR DEVICE AND METHOD FOR MANUFACTURING THE SAME

BACKGROUND OF THE INVENTION

1. Technical Field of the Invention

The present invention relates to a semiconductor device employing copper interconnects therein, and more particularly to a semiconductor device employing aluminum as bonding pads in addition to the copper interconnects to improve reliability of semiconductor device, and further a method for manufacturing the same.

2. Description of the Related Art

Generally, copper exhibits low resistance and provides high resistance against electromigration, and therefore, it becomes apparent that copper is the material of choice for interconnect lines and contacts in future generations including the subquarter-micron generation. At the same time, copper is essentially a material that is quite easily oxidized and easily enhances its oxidation due to moisture in air, and once when copper begins oxidation, the copper allows the oxidation to deeply progress into the inside of the copper without staying the surface layer thereof. For this reason, when a bonding pad is formed of a part of copper interconnects and an oxide layer is formed on a surface of the bonding pad, a bonding ball cannot be bonded to the bonding pad with sufficient adhesion strength. In addition, even when the bonding ball could successfully be bonded thereto, corrosion due to oxidation of copper would start from an exposed portion of the bonding pad, which portion is not covered by the bonding ball, and finally spread over the entire surface of the bonding pad. When formation of the corrosion is further enhanced, copper interconnects themselves are unfavorably corroded.

Accordingly, when copper is employed as an interconnects material, a bonding pad made of a material excluding copper and providing high resistance against oxidation is formed on an upper portion of copper interconnects, which technique is generally employed in this technical field. For example, Japanese Patent Application Laid-open No. 7(1995)-201909 discloses a technique in which a tungsten film is laminated on copper interconnects to form a bonding pad. Furthermore, Japanese Patent Application Laid-open No. 10(1998)-340920 discloses a technique in which a conductive film containing aluminum therein is laminated on copper interconnects to form a bonding pad. That is, in both the techniques disclosed in the above-stated publications, copper interconnects are covered by an insulation film and openings are formed in the insulation film to expose a part of the copper interconnects, and then, a conductive film made of tungsten, aluminum or the like is formed within each of the openings on the copper interconnects to thereby form a bonding pad.

However, according to the techniques disclosed in those publications, when a thickness of the insulation film covering the copper interconnects is made large, a film thickness of tungsten, aluminum or the like constituting the bonding pad becomes large, likely presenting performance and manufacturing problems. In particular, an insulation film consisting of a laminated structure having a copper diffusion barrier layer for preventing diffusion of copper and an insulation film is formed into a thick film, presenting a serious problem. For example, FIGS. 1A through 1E each illustrate a cross sectional view of an example in the order of manufacturing steps and the example is constructed by forming a bonding pad made of aluminum on copper interconnects.

Referring to FIG. 1A, a silicon oxide film 201 is formed on a surface of a semiconductor substrate (not shown) having elements such as transistors formed in a surface portion thereof and a trench 202 for an interconnect pattern is formed in the silicon oxide film 201, and then, a barrier metal 203 is formed on an entire surface of a semiconductor device to fill the trench 202 with the barrier metal to prevent copper from diffusing into the oxide, and further, a copper film is formed thereon by a plating method or the like. Subsequently, the copper film on the silicon oxide film 201 is polished such as by a CMP (Chemical Mechanical Polishing) method to leave the copper film only within the trench 202 to thereby form a copper pad 205 that constitutes one piece structure together with copper interconnects (not shown).

Thereafter, as shown in FIG. 1B, a copper diffusion barrier layer 206 made of a silicon nitride film or the like and a silicon oxide film 207 are laminated to cover a surface of the above-stated copper pad 205 to thereby form an inter layer insulation film 208. Then, an opening 209 is formed in the inter layer insulation film 208 to expose a part of the copper pad 205.

Subsequently, as shown in FIG. 1C, a titanium nitride film 212 for preventing reaction between copper and aluminum, an aluminum film 213 and a titanium nitride film 214 for reducing reflectance of a surface of aluminum to make possible the application of photolithography technology in forming a fine interconnect pattern are formed in order.

Then, as shown in FIG. 1D, the titanium nitride film 214, aluminum film 213 and titanium nitride film 212 are etched using a photolithography technique to thereby form an aluminum pad 213 made of the aluminum film 213.

Furthermore, as shown in FIG. 1E, an insulating protection film 215 made of a silicon oxide film or the like is deposited on an entire surface of the semiconductor substrate. Thereafter, the insulating protection film 215 and the titanium nitride film 214 on the aluminum pad 213 are selectively etched and removed using a photolithography technique to expose a surface of the aluminum film 213 to thereby complete formation of bonding pad.

The conventional bonding pad constructed by forming the inter layer insulation film 208 consisting of a laminated structure having the copper diffusion barrier layer 206 for preventing copper diffusion from the copper pad 205 and the silicon oxide film 207, and the insulating protection film 215 positioned on the inter layer insulation film includes the following problem. That is, since the inter layer insulation film 208 is formed on the copper pad 205 to resultantly have a large film thickness owing to its laminated structure and the aluminum pad 213 is formed so as to cover the opening 209 that is formed in the inter layer insulation film 208, the aluminum pad 213 is forced to have a large step, which is formed by the opening 209, and therefore, the step coverage of the aluminum pad 213 at the opening 209 is deteriorated, whereby the copper pad 205 under the aluminum pad 213 suffers from corrosion and/or oxidation due to leakage of moisture and/or oxygen through a portion corresponding to nonconformal step coverage of the aluminum pad 213 at the opening.

To prevent such problems, the technique disclosed in the above-described publication may be modified such that aluminum is formed within both the openings 209 and 216 that are respectively formed in the inter layer insulation film 208 and the insulating protection film 215 positioned thereon, thereby forming an aluminum pad. However, since a total thickness of the inter layer insulation film 208 and the insulating protection film 215 positioned thereon is large, the aluminum pad 213 is forcibly formed into an extremely thick film while making process time necessary for depositing aluminum into the openings 209, 216 extremely long, unfavorably increasing manufacturing cost. The technique may also be modified such that aluminum is formed only within the opening 209 of the inter layer insulation film 208 to form an aluminum pad. However, the aluminum pad 213 formed as described above allows moisture or oxygen to leak through a nonconformal portion formed in the aluminum pad 213 to likely oxidize the copper pad 205 lying directly under the aluminum pad 213, thereby causing the breaking of a part of copper interconnects which include the copper pad 205 as a part thereof and leading to degradation of reliability of a semiconductor device having such construction of bonding pad.

SUMMARY OF THE INVENTION

An object of the present invention is to provide a semiconductor device, in which a copper film is interposed between a copper pad and an aluminum pad to reduce a step formed under the aluminum pad to thereby improve reliability of a bonding pad while preventing increase in manufacturing cost of semiconductor device, and further, to offer a method for manufacturing the same.

A semiconductor device according to the present invention comprises a copper pad formed as a part of copper interconnects within a trench formed in an insulation film on a semiconductor substrate, an inter layer insulation film formed to cover the copper pad, a connection copper via metal formed within a connection via hole formed in the inter layer insulation film on the copper pad, an aluminum pad formed on the connection copper via metal and an insulating protection film formed to cover the aluminum pad and having an opening for bonding on the aluminum pad. The semiconductor device may further be constructed such that aluminum interconnects formed from the same layer as the aluminum pad and a connection copper via metal for interconnect formation formed from the same layer as the connection copper via metal, in which the copper interconnects and the aluminum interconnects are electrically connected to each other through the connection copper via metal for interconnect formation.

A method for manufacturing a semiconductor device according to the present invention comprises the steps of forming copper interconnects while forming a copper pad as a part of said copper interconnects within a trench formed in an insulation film on a semiconductor substrate, forming an inter layer insulation film to cover the copper pad, forming a connection via hole in the inter layer insulation film on the copper pad to expose the copper pad, forming a connection copper via metal by filling the connection via hole with copper, forming an aluminum pad on the connection copper via metal, forming an insulating protection film to cover the aluminum pad and forming an opening for bonding in the insulating protection film on the aluminum pad to expose the aluminum pad.

The semiconductor device constructed in accordance with the present invention is manufactured such that a connection via hole is formed in an inter layer insulation film that covers a copper pad, a connection copper via metal is formed within the connection via hole and an aluminum pad is formed on the connection copper via metal. Accordingly, a step formed under the aluminum pad is made substantially equal to zero with the aid of the connection copper via metal and at the same time, a film thickness of the aluminum pad is reduced, thereby reducing manufacturing cost of the semiconductor device. Moreover, even when the connection copper via metal directly lying under the aluminum pad is oxidized, oxidation of the connection copper via metal never affects the copper pad located under the connection copper via metal, thereby advantageously preventing the breaking of the copper interconnects connected to the copper pad.

DETAILED DESCRIPTION OF THE PREFERRED EMBODIMENTS

Figure 1A:
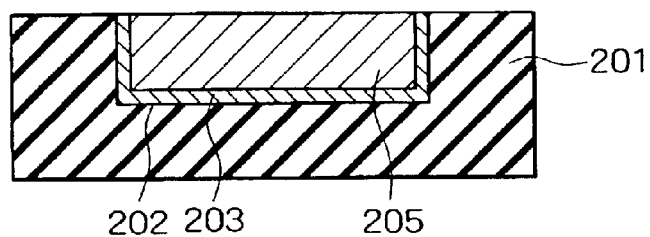
FIGS. 1A through 1E each are cross sectional views of a bonding pad of a conventional semiconductor device, illustrating a method for manufacturing the semiconductor device employing the bonding pad in the order of manufacturing steps.
Figure 1B:
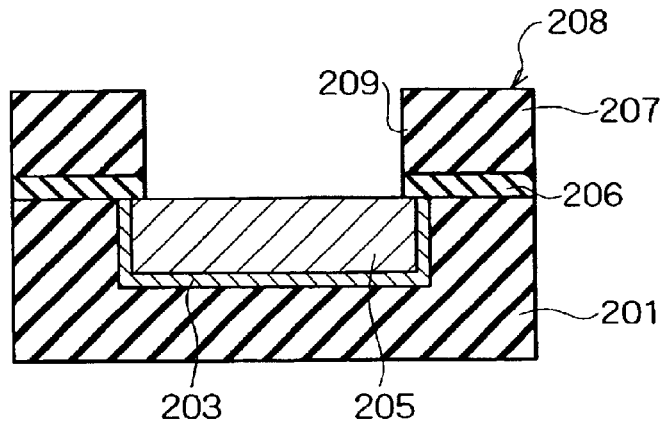
Figure 1C:
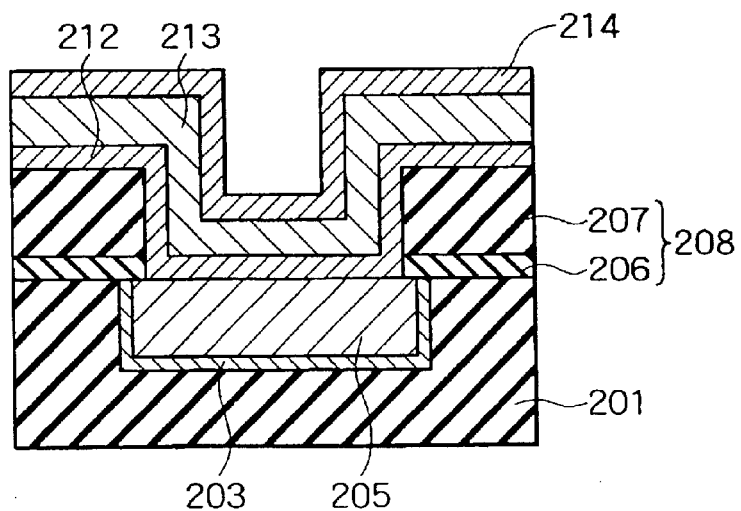
Figure 1D:
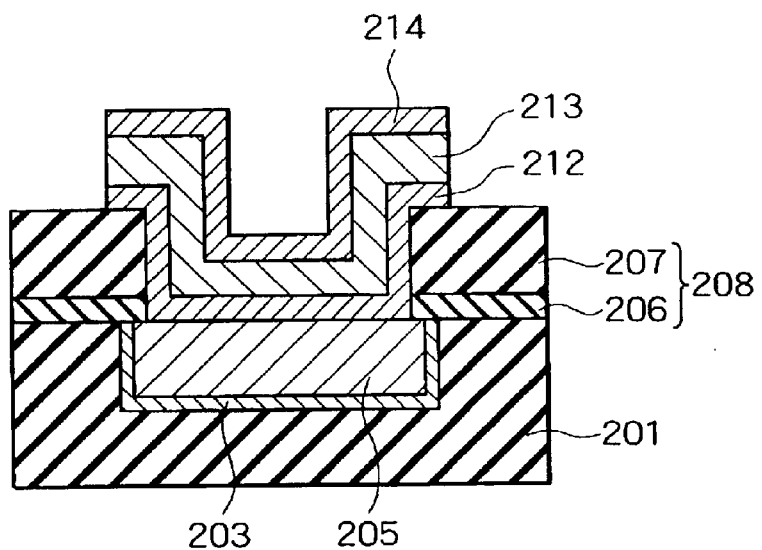
Figure 1E:
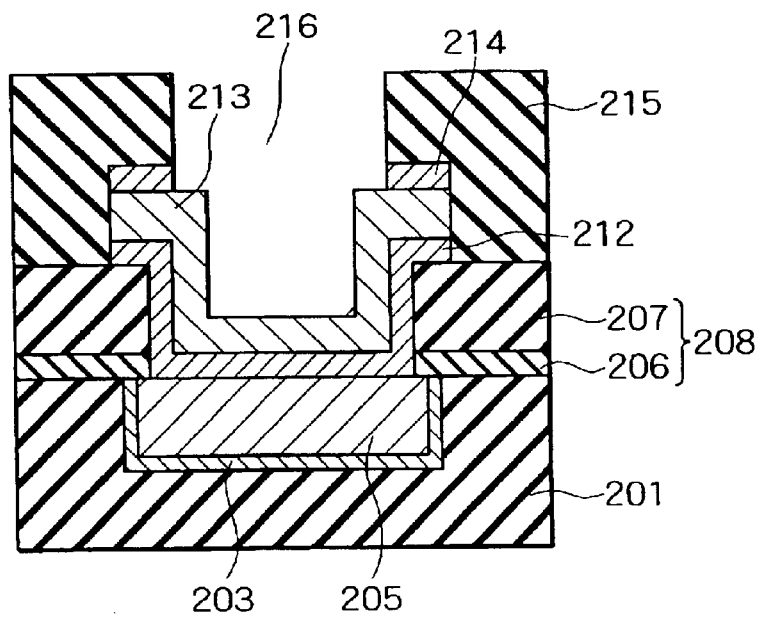
Figure 2A:
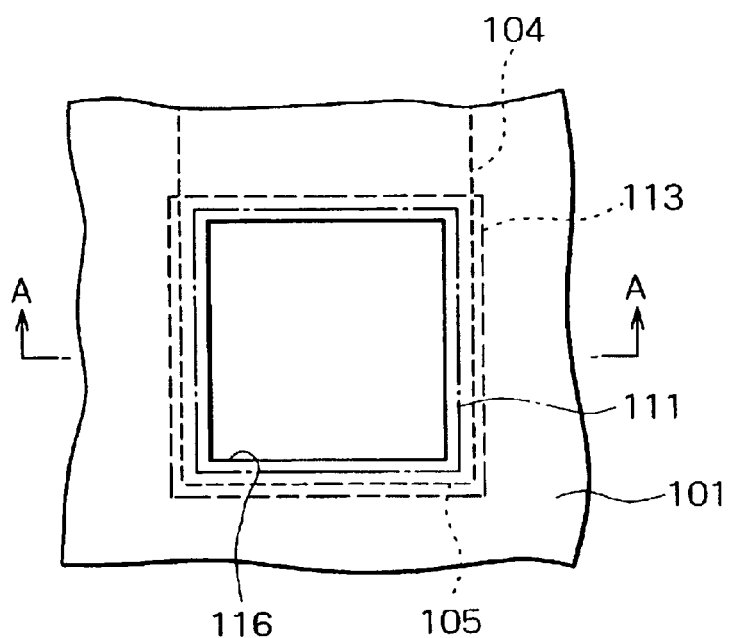
FIG. 2A is a plan view of a bonding pad of a first embodiment of the preset invention and FIG. 2B is a cross sectional view taken along the line A—A shown in FIG. 2A.
Figure 2B:
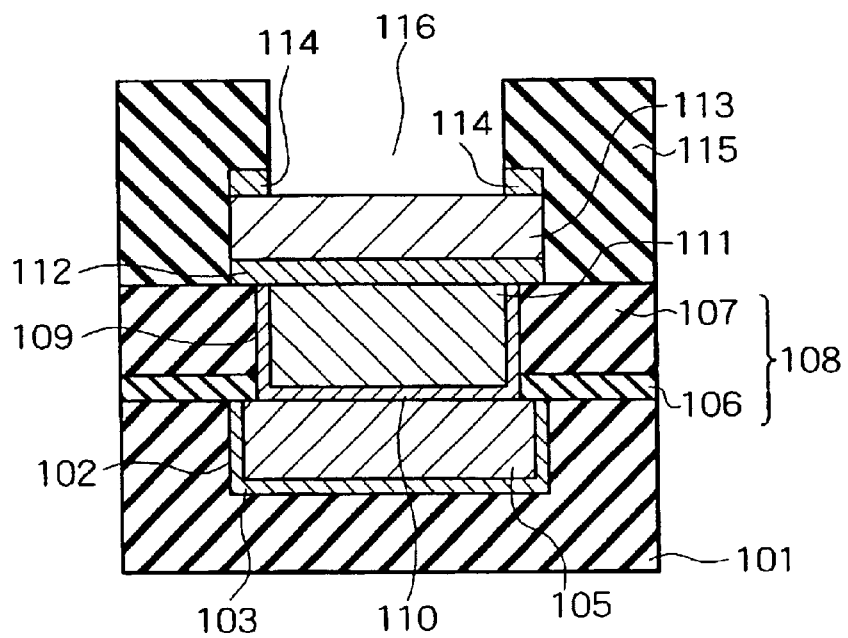

Preferred embodiments of the present invention will be explained with reference to the attached drawings. FIG. 2A is a plan view of a bonding pad of a semiconductor device constructed in accordance with a first embodiment of the present invention and FIG. 2B is a cross sectional view of the bonding pad taken along the line A—A shown in FIG. 2A. A silicon oxide film 101 is formed on a surface of a semiconductor substrate (not shown) having elements such as transistors formed in a surface portion thereof and a trench 102 is formed to have an interconnect pattern in the silicon oxide film 101, and then, a barrier metal film 103 is formed on an inner surface of the trench 102, and further, copper interconnects 104 are formed so as to fill the space surrounded by the barrier metal film within the trench 102 while presenting a copper pad 105 as a part of copper interconnects 104. Furthermore, a copper diffusion barrier layer 106 and a silicon oxide film 107 are laminated to form an inter layer insulation film 108 and a connection via hole 109 is formed in the inter layer insulation film 108 to expose the copper pad 105. Then, a barrier metal film 110 is formed on an inner surface of the connection via hole 109 and copper is formed within the connection via hole 109 to thereby form a connection copper via metal 111. Thereafter, on the connection copper via metal 111 is formed an aluminum pad 113 having a lower titanium nitride film 112 thereunder and an upper titanium nitride film 114 thereon, respectively. Additionally, an upper insulating protection film 115 is formed to cover the aluminum pad 113 and an opening 116 for bonding is formed in the insulating protection film 115 to expose a surface of the aluminum pad 113, thereby completing formation of bonding pad.

Subsequently, a method for manufacturing the bonding pad shown in FIGS. 2A, 2B will be explained with reference to cross sectional views shown in FIGS. 3A through 3E in the order of manufacturing steps.

Figure 3A:
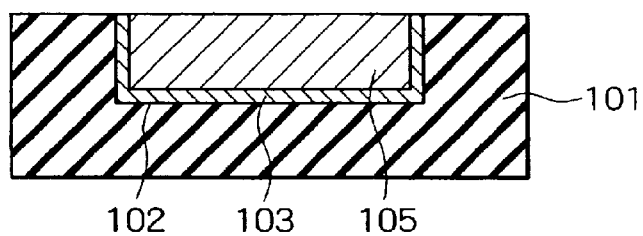
FIGS. 3A through 3E each are cross sectional views of a semiconductor device of the first embodiment shown in FIGS. 2A, 2B, illustrating a method for manufacturing the semiconductor device in the order of manufacturing steps.

First, as shown in FIG. 3A, a silicon oxide film 101 is formed on a surface of a semiconductor substrate (not shown) having elements such as transistors or multi-layer interconnects formed in a surface portion thereof and a trench 102 is formed in the silicon oxide film 101 to have a specific pattern to form copper interconnects and copper pads therein. Then, a barrier metal 103 for preventing diffusion of copper into the oxide is formed into a thin film covering an entire surface of the semiconductor substrate, and further, copper film is formed thereon by a selective plating method or the like to completely fill the trench 102. Subsequently, the entire copper film on the silicon oxide film 101 is polished back such as by a CMP method to leave the copper film only within the trench 102 to thereby form copper interconnects 104 (refer to FIGS. 2A, 2B) and a copper pad 105 connected to the copper interconnects, both of which have a flattened surface.

Figure 3B:
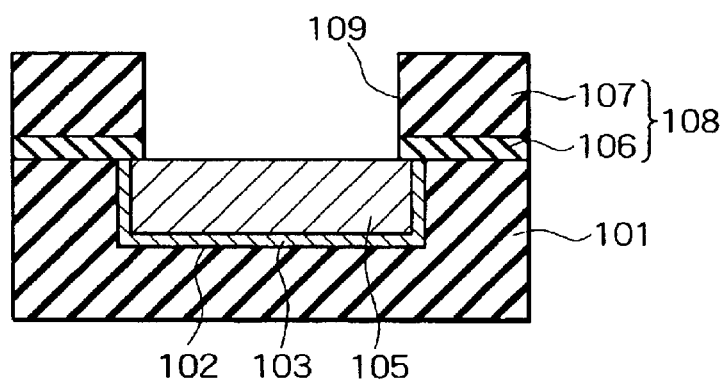

Thereafter, as shown in FIG. 3B, a copper diffusion barrier layer 106 made of a silicon nitride film (SiN) or the like and a silicon oxide film 107 are laminated in this order covering a surface of the copper pad 105 to form an inter layer insulation film 108. Then, a connection via opening 109 is formed in the inter layer insulation film 108 to expose the surface of the copper pad 105.

Figure 3C:
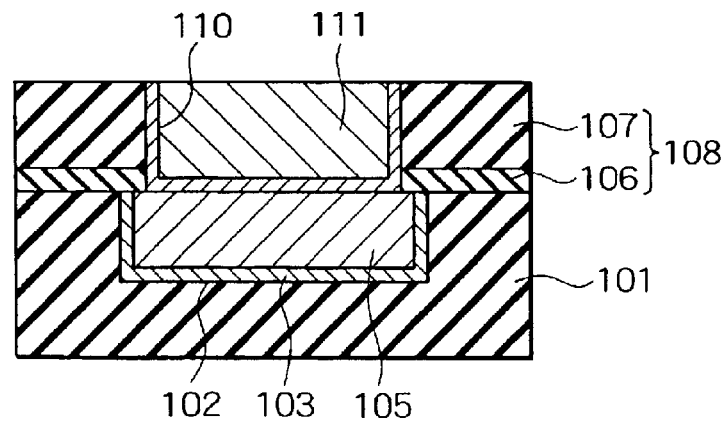

Subsequently, as shown in FIG. 3C, a barrier metal film 110 made of a refractory metal or the like and provided for preventing diffusion of copper into the silicon oxide film 107 is formed into a thin film covering an entire surface of the substrate, and a copper film 111 is formed on the barrier metal film 110 by a selective plating method or the like to completely fill the connection via hole 109. Then, the entire copper film and barrier metal film 110 are polished back such as by a CMP method to leave the copper film 111 only within the connection via hole 109 to thereby form a connection copper via metal 111 having a flattened surface.

Figure 3D:
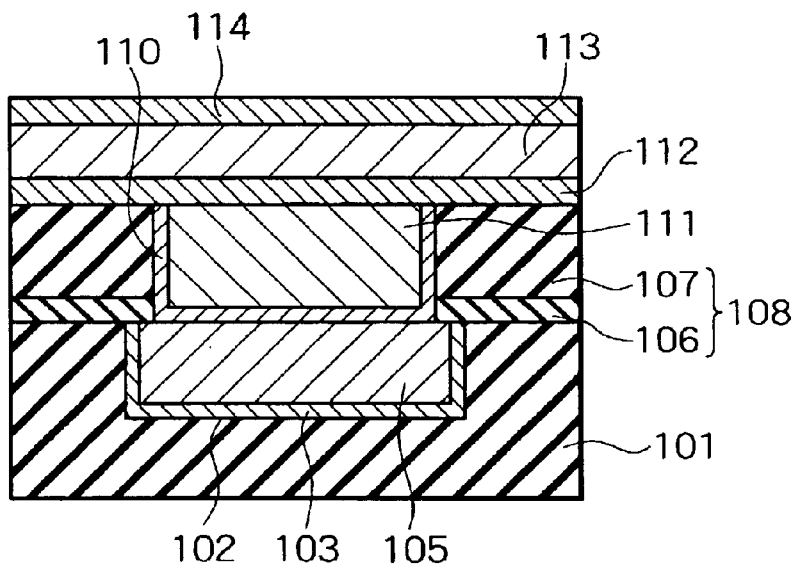

Thereafter, as shown in FIG. 3D, a lower titanium nitride film 112 for preventing reaction between copper and aluminum is deposited on an entire surface of the substrate and an aluminum film 113 is deposited thereon, and further, an upper titanium nitride film 114 for reducing reflectance of a surface of aluminum to make easy the application of photolithography technology in forming an aluminum interconnect pattern is deposited thereon to thereby form a multi-layer film.

Figure 3E:
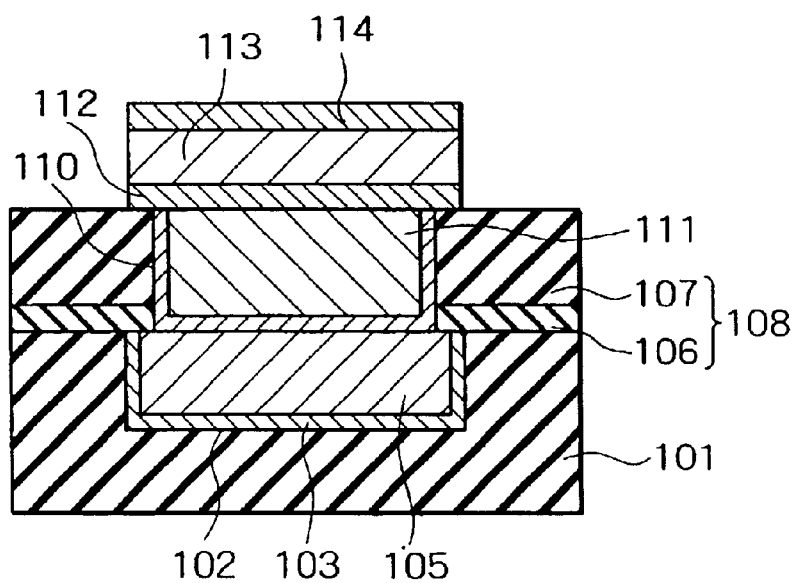

Subsequently, as shown in FIG. 3E, the multi-layer film is etched and removed by a photolithography technique to form a specific pattern in the multi-layer film, thereby forming an aluminum pad 113 having the titanium nitride films 112, 114 thereunder and thereon, respectively.

The semiconductor device constructed as described above is further subjected to the following steps. That is, as is already shown in FIGS. 2A, 2B, an insulating protection film 115 made of a silicon nitride film is deposited on an entire surface of the substrate and a part of the insulating protection film 115 located above the aluminum pad 113 is etched and removed to form an opening 116 for bonding, and then, a part of the upper titanium nitride film 114 exposed by the opening 116 for bonding is etched and removed to expose a surface of the aluminum pad 113 through the bonding opening 116 to the outside, thereby completing formation of a semiconductor device that employs bonding pads made of aluminum and formed on copper interconnects in accordance with the embodiment.

Figure 4A:
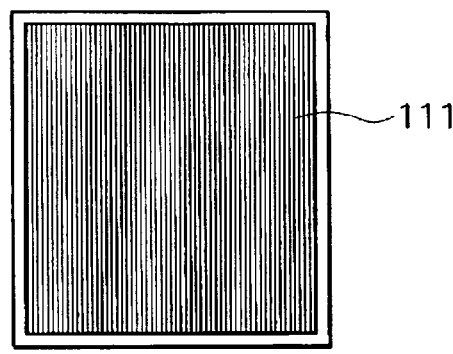
FIGS. 4A through 4D each are plan views of a exemplified modification pattern of a connection copper via metal of the semiconductor device of the preset invention.
Figure 4B:
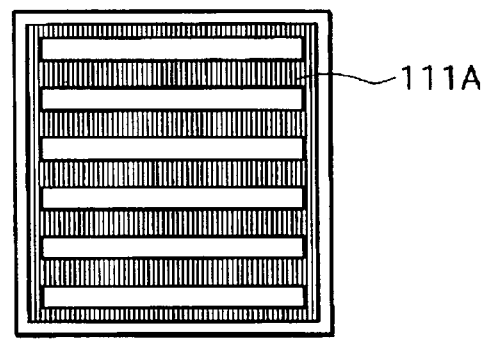
Figure 4C:
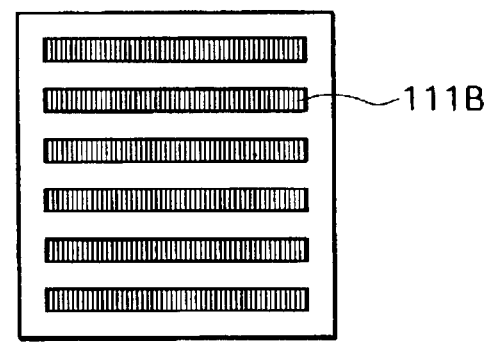
Figure 4D:
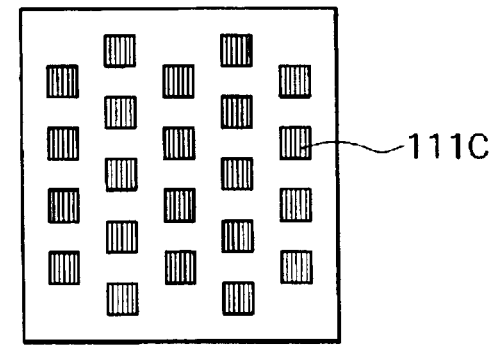

It should be noted that although the above-described embodiment is constructed, as shown in FIG. 4A, such that the connection copper via metal 111 for connecting the copper pad 105 and the aluminum pad 113 together is formed as a rectangle-shaped and single connection copper via metal having an area a little bit smaller than that of the copper pad 105, the geometric shape of the connection copper via metal of the present invention is not limited to such geometric construction. For instance, as shown in FIG. 4B, the connection copper via metal 111A may be formed to have a geometric shape of lattice frame or as shown in FIG. 4C, the connection copper via metal 111B may be formed to have a geometric shape of parallel stripes. Or, as shown in FIG. 4D, the connection copper via metal 111C may be formed to have a geometric shape such that a plurality of minute rectangles made of a connection copper via metal are disposed to form a random pattern, for example, a checked pattern. Particularly, constructing a connection copper via metal as shown in FIGS. 4B through 4D advantageously makes it possible to easily fill a connection via hole with copper and further form coppers within the connection via holes to have a uniform film thickness through a step for polishing copper using a CMP method to flatten the copper within the connection via hole.

According to the above-described construction of bonding pad, even in a semiconductor device comprising an inter layer insulation film 108 consisting of a laminated structure having a copper diffusion barrier layer 106 for preventing diffusion of copper and a silicon oxide film 107, and an insulating protection film 115 formed on the inter layer insulation film 108, since a connection copper via metal 111 lies under an aluminum pad 113 as a bonding pad, a step, which should be covered by the aluminum pad 113 in a subsequent process step, formed by a connection via hole 109 of the inter layer insulation film can be made to have a height substantially equal to zero. At the same time, the aluminum pad 113 formed on the connection via hole 109 can be formed into a thin film, preventing increase in manufacturing cost. In addition, since both the copper pad 105 and the connection copper via metal 111 can be realized respectively through the similar process steps such that copper films are deposited by a selective plating method respectively into a trench and an opening, which are formed respectively in insulation films such as the silicon oxide film 101 and the inter layer insulation film 108, and further, the surfaces of the copper films thus deposited each are flattened by a CMP method, manufacture of the connection copper via metal 111 can easily be performed even when process steps necessary for formation of the connection copper via metal 111 have to be added to the process steps necessary for formation of a conventional bonding pad. Furthermore, under the lower surface of the aluminum pad 113 exists a lower titanium nitride film 112 for preventing reaction between aluminum and copper and therefore, copper constituting the connection copper via metal 111 can be prevented from reacting with aluminum to diffuse through the aluminum into the insulating protection film 115. Moreover, even when the connection copper via metal 111 directly lying under the aluminum pad 113 is oxidized, the copper pad 105 lying under the connection copper via metal 111 as a part of copper interconnects 104 is never oxidized, thereby preventing the breaking of the copper interconnects 104.

Figure 5:
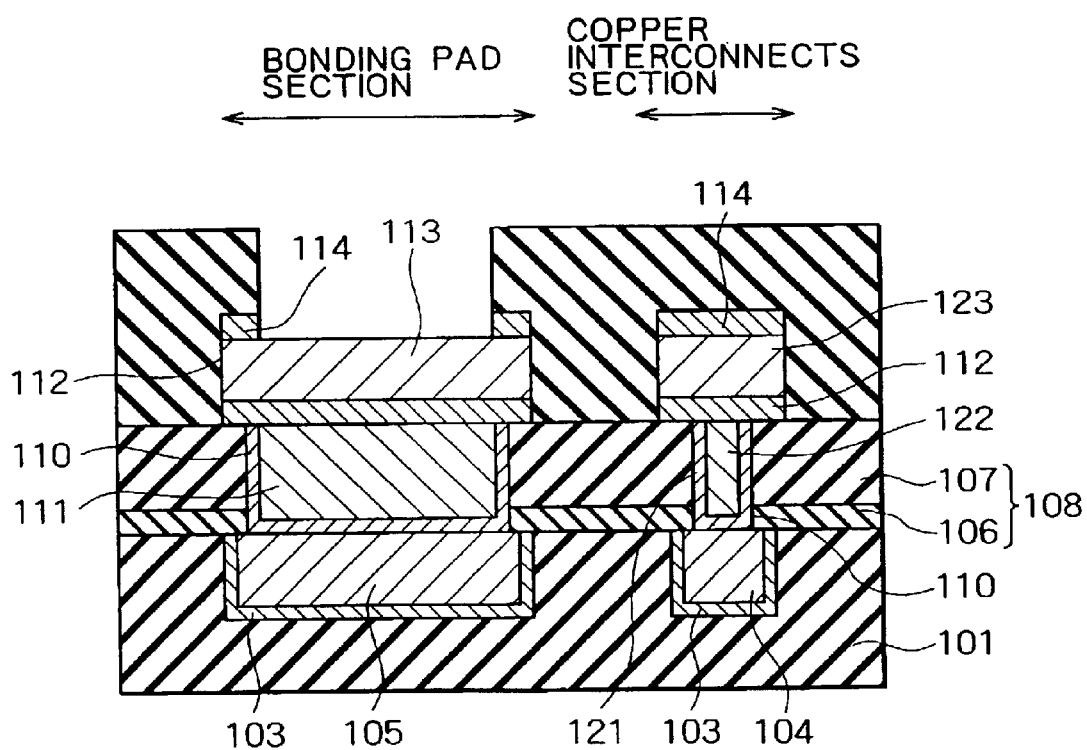
FIG. 5 is a cross sectional view of a bonding pad and interconnects of a second embodiment of the preset invention.

A semiconductor device constructed in accordance with a second embodiment of the present invention will be explained with reference to the drawings. The second embodiment is constructed differently from the first embodiment such that in the second embodiment, aluminum interconnects are formed of aluminum that also constitutes an aluminum pad 112. Referring to FIG. 5, copper interconnects 104 are formed together with a copper pad 105 in a silicon oxide film 101 on a semiconductor substrate. Furthermore, in a portion where a bonding pad is to be formed, a connection copper via metal 111 is formed such that a connection via hole 109 is formed in an inter layer insulation film 108 on the copper pad 105 and then, is filled with copper. On the other hand, in a portion where copper interconnects are to be formed, a connection copper via metal 122 for interconnect formation is formed such that a minute connection via hole 121 for interconnect formation is formed in the inter layer insulation film 108 and then, the inner walls of the connection via hole 121 are covered by a blanket barrier metal 110, and further, the connection via hole 121 is filled with copper. After formation of the connection copper via metals 111 and 122, in a portion where a bonding pad is to be formed, an aluminum pad 113 is formed in a manner similar to that employed in the first embodiment, thereby being resultantly connected to the connection copper via metal 111. Furthermore, in a portion where copper interconnects are to be formed, aluminum interconnects 123 sandwiched by lower and upper barrier metals 112, 114 and having the same pattern as that of the copper interconnects 104 are formed, thereby being resultantly connected to the copper interconnects 104 through the connection copper via metal 122 for interconnect formation. It should be understood that the aluminum interconnects are formed in the same process step as that for forming the aluminum pad 113.

The second embodiment of the present invention constructed as described above can produce the same effect as that explained in the description of the first embodiment and in addition, is advantageously able to allow a semiconductor device to operate at a higher rate because the copper interconnects resultantly exhibit low resistance by connecting the aluminum interconnects to the copper interconnects through the connection copper via metal for interconnect formation. Furthermore, since the connection copper via metal for interconnect formation is formed within the connection via hole of the inter layer insulation film to thereby have a flattened surface in a manner similar to that employed to form the connection copper pad, the breaking of the aluminum interconnects due to the step formed by the connection via hole never occurs, thereby achieving highly reliable interconnection in a semiconductor device.

It should be appreciated that although the embodiments employ a silicon nitride film as the copper diffusion barrier layer 106 for preventing diffusion of copper, instead of the silicon nitride film, the embodiments can employ any one selected from the group consisting of a silicon carbide film (SiC), a silicon oxynitride film (SiON) and a silicon carbonitride film. In addition, instead of aluminum constituting the aluminum pad 113, any one selected from the group consisting of an alloy film of aluminum and copper, a film formed by making aluminum contain silicon therein and a film formed by making an alloy of aluminum and copper contain silicon therein may be employed in the embodiments. Moreover, although the lower barrier metal 112 and the upper barrier metal 114, both of which are formed to prevent diffusion of copper, are made of a titanium nitride film in the embodiments, the lower and upper barrier metals may be made of a titanium film or a laminated film consisting of a titanium film and a titanium nitride film instead of a titanium nitride film.

Additionally, instead of the copper film used to form the copper pad 105, the connection copper via metal 111 and the connection copper via metal 122 for interconnect formation, a copper alloy may be used in the embodiments, and furthermore, instead of the plating method employed to form a copper film, a sputtering method may be employed in the embodiments. Moreover, instead of the above-mentioned CMP method as a technique for flattening the surface of the copper film, an etch back method may be employed in the embodiments.

It should be understood that although, in the embodiments, construction of associated layers that are to be formed as an uppermost layer of a semiconductor device and located above copper interconnects is illustrated and explained, the construction of associated layers may also be applied to a semiconductor device having a multi-layer structure comprising another copper interconnects below the above-mentioned copper interconnects.

As described so far, the present invention is constructed such that a connection via hole is formed in an inter layer insulation film that covers a copper pad, copper is formed within the connection via hole to form a connection copper via metal and an aluminum pad is formed on the connection copper via metal, thereby electrically connecting the copper pad and the aluminum pad to each other through the connection copper via metal. Accordingly, a step formed by the connection via hole that is formed in the inter layer insulation film is made substantially equal to zero with the aid of the connection copper via metal and at the same time, a film thickness of aluminum constituting the aluminum pad is reduced, thereby reducing manufacturing cost of a semiconductor device. Moreover, even when the connection copper via metal directly lying under the aluminum pad is oxidized, oxidation of the connection copper via metal never affects the copper pad located under the connection copper via metal, thereby advantageously preventing the breaking of the copper interconnects connected to the copper pad.

What is claimed is:

1. A semiconductor device comprising:
   a semiconductor substrate;
   an insulation film formed on said semiconductor substrate;
   copper interconnects embedded in a trench formed in said insulation film;
   a copper pad formed as a part of said copper interconnects;
   an inter layer insulation film formed to cover said copper pad;
   a connection copper via metal embedded within a connection via hole formed in said inter layer insulation film on said copper pad;
   an aluminum pad formed on said connection copper via metal; and
   an insulating protection film formed to cover said aluminum pad and having an opening for bonding on said aluminum pad.

2. The semiconductor device according to claim 1 further comprising:
   aluminum interconnects formed from the same layer as said aluminum pad; and
   a connection copper via metal for interconnect formation formed from the same layer as said connection copper via metal,
      wherein said copper interconnects and said aluminum interconnects are electrically connected to each other through said connection copper via metal for interconnect formation.

3. The semiconductor device according to claim 1, wherein said inter layer insulation film consists of a laminated structure having a copper diffusion barrier layer for preventing diffusion of copper and a silicon oxide film.

4. The semiconductor device according to claim 3, wherein said copper diffusion barrier layer for preventing diffusion of copper is formed of one selected from the group consisting of a silicon nitride film (SiN), a silicon carbide film (SiC), a silicon oxynitride film (SiON) and a silicon carbonitride film (SiCN).

5. The semiconductor device according to claim 1, wherein said aluminum pad is comprised of one selected from the group consisting of an aluminum film, an alloy film of aluminum and copper, an aluminum film containing silicon and an alloy film of aluminum and copper containing silicon.

6. The semiconductor device according to claim 1, further comprising a barrier metal formed under said aluminum pad and to prevent said aluminum pad from reacting with copper, wherein said barrier metal is comprised of one selected from the group consisting of a titanium film, a titanium nitride film and a laminated film composed of a titanium film and a titanium nitride film.

7. A method for manufacturing a semiconductor device, comprising the steps of:

forming copper interconnects while forming a copper pad as a part of said copper interconnects within a trench formed in an insulation film on a semiconductor substrate;

forming an inter layer insulation film to cover said copper pad;

forming a connection via hole in said inter layer insulation film on said copper pad to expose said copper pad;

forming a connection copper via metal by filling said connection via hole with copper;

forming an aluminum pad on said connection copper via metal;

forming an insulating protection film to cover said aluminum pad; and forming an opening for bonding in said insulating protection film on said aluminum pad to expose said aluminum pad.

8. The method for manufacturing a semiconductor device according to claim 7, wherein said forming of said copper interconnects comprises the steps of:

depositing a copper film to fill said trench with said copper film after depositing a barrier metal film as an underlying layer for said copper film; and flattening a surface of said insulation film and said copper film so as to leave said copper film only within said trench.

9. The method for manufacturing a semiconductor device according to claim 7, wherein said forming of said connection copper via metal comprises:

depositing a copper film to fill said connection via hole with said copper film after depositing a barrier metal film as an underlying layer for said copper film; and flattening a surface of said inter layer insulation film and said copper film so as to leave said copper film only within said connection via hole.

10. The method for manufacturing a semiconductor device according to claim 8, wherein said copper film is formed by a selective plating method and a surface of said copper film is flattened by one of an etch back method and a CMP (Chemical Mechanical Polishing) method.

* * * * *